(12) United States Patent
Amin et al.

(10) Patent No.: US 8,203,875 B2
(45) Date of Patent: Jun. 19, 2012

(54) ANTI-PARALLEL DIODE STRUCTURE AND METHOD OF FABRICATION

(75) Inventors: Nurul Amin, Woodbury, MN (US); Insik Jim, Eagan, MN (US); Venugopalan Vaithyanathan, Bloomington, MN (US); Wei Tian, Bloomington, MN (US); YoungPil Kim, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/014,917

(22) Filed: Jan. 27, 2011

(65) Prior Publication Data
US 2011/0122678 A1 May 26, 2011

Related U.S. Application Data

(63) Continuation of application No. 12/501,796, filed on Jul. 13, 2009, now Pat. No. 7,911,833.

(51) Int. Cl.
*G11C 11/36* (2006.01)
(52) U.S. Cl. ........ 365/175; 365/148; 365/158; 257/240; 257/E29.327
(58) Field of Classification Search ............... 365/148, 365/175, 158; 257/204, E29.327
See application file for complete search history.

(56) References Cited

U.S. PATENT DOCUMENTS

| | | | |
|---|---|---|---|
| 3,982,233 A | 9/1976 | Crookshanks | |
| 4,056,642 A | 11/1977 | Saxena et al. | |
| 4,110,488 A | 8/1978 | Risko | |
| 5,135,878 A | 8/1992 | Bartur | |
| 5,739,564 A | 4/1998 | Kosa et al. | |
| 6,979,863 B2 | 12/2005 | Ryu | |
| 7,911,833 B2 * | 3/2011 | Amin et al. | 365/175 |
| 2005/0145947 A1 | 7/2005 | Russ et al. | |
| 2007/0113884 A1 | 5/2007 | Kinsey et al. | |
| 2008/0029782 A1 | 2/2008 | Carpenter et al. | |
| 2008/0048327 A1 | 2/2008 | Lee | |
| 2008/0261380 A1 | 10/2008 | Lee | |
| 2009/0014719 A1 | 1/2009 | Shimizu et al. | |
| 2009/0072246 A1 | 3/2009 | Genrikh et al. | |
| 2009/0162979 A1 | 6/2009 | Yang et al. | |
| 2009/0185410 A1 | 7/2009 | Huai et al. | |
| 2009/0296449 A1 | 12/2009 | Slesazeck et al. | |
| 2010/0110756 A1 | 5/2010 | Khoury et al. | |

FOREIGN PATENT DOCUMENTS

EP 1329895 A2 7/2003

* cited by examiner

*Primary Examiner* — Hoai V Ho
(74) *Attorney, Agent, or Firm* — Hall Estill Attorneys at Law

(57) ABSTRACT

An anti-parallel diode structure and method of fabrication is presently disclosed. In some embodiments, an anti-parallel diode structure has a semiconductor region comprising a first insulator layer disposed between a first semiconductor layer and a second semiconductor layer. The semiconductor region can be bound on a first side by a first metal material and bound on a second side by a second metal material so that current below a predetermined value is prevented from passing through the semiconductor region and current above the predetermined value passes through the semiconductor region.

20 Claims, 9 Drawing Sheets

ANTI-PARALLEL DIODE STRUCTURE AND METHOD OF FABRICATION

Related Applications

This application claims priority as a continuation of co-pending U.S. patent application No. 12/501,796 filed Jul. 13, 2009, entitled Anti-parallel Diode Structure and Method of Fabrication, which issued as U.S. Pat. No. 7,911,833 on Mar. 22, 2011.

BACKGROUND

Solid state memories (SSMs) often comprise one or more arrays of individually programmable memory cells configured to store data by the application of write currents to the cells to store a sequence of bits. The stored bits can be subsequently read during a read operation by applying suitable read currents and sensing voltage drops across the cells.

A continued trend is to provide SSM arrays with larger data capacities and smaller manufacturing process feature sizes. While operable in providing greater data storage capacity and density levels, the use of increasingly larger arrays and/or smaller feature sizes can lead to significant increases in inadvertent operational variance, such as variations in the sensing of logical states in cross-point arrays of memory.

With increasing usage of bi-polar memory cells in SSM, it has been found that unwanted current can be induced along various control lines. Such unwanted current can be great enough to cause the inadvertent programming of memory cells. This can make it difficult to accurately write or read a programmed state of a particular memory cell, particularly when relatively small magnitudes of sense voltages are used. Therefore, there is a need for more efficient anti-parallel diode designs.

SUMMARY

Various embodiments of the present invention are directed to an anti-parallel diode structure and a method of fabrication thereof.

In some embodiments, an anti-parallel diode structure has a semiconductor region comprising a first insulator layer disposed between a first semiconductor layer and a second semiconductor layer. The semiconductor region can be bound on a first side by a first metal material and bound on a second side by a second metal material so that current below a predetermined value is prevented from passing through the semiconductor region and current above the predetermined value passes through the semiconductor region.

These and various other features and advantages which characterize the various embodiments of the present invention can be understood in view of the following detailed discussion and the accompanying drawings.

DETAILED DESCRIPTION

The present disclosure generally relates to an anti-parallel diode structure and to the fabrication of such a structure. Memory arrays often experience the presence of unwanted current (leak current) corresponding to a selected row or column of memory cells. Such unwanted current provides several operational disadvantages such as large power demands and the reading or writing of data to non-selected memory cells.

Accordingly, the use of an anti-parallel diode structure that has a semiconductor region with a first insulator layer disposed between a first semiconductor layer and a second semiconductor layer prevents unwanted current from reaching a connected resistive sense element. In some embodiments, the semiconductor region is bound on a first side by a first metal material and bound on a second side by a second metal material so that current below a predetermined value is prevented from passing through the semiconductor region and current above the predetermined value passes through the semiconductor region.

Figure 1:
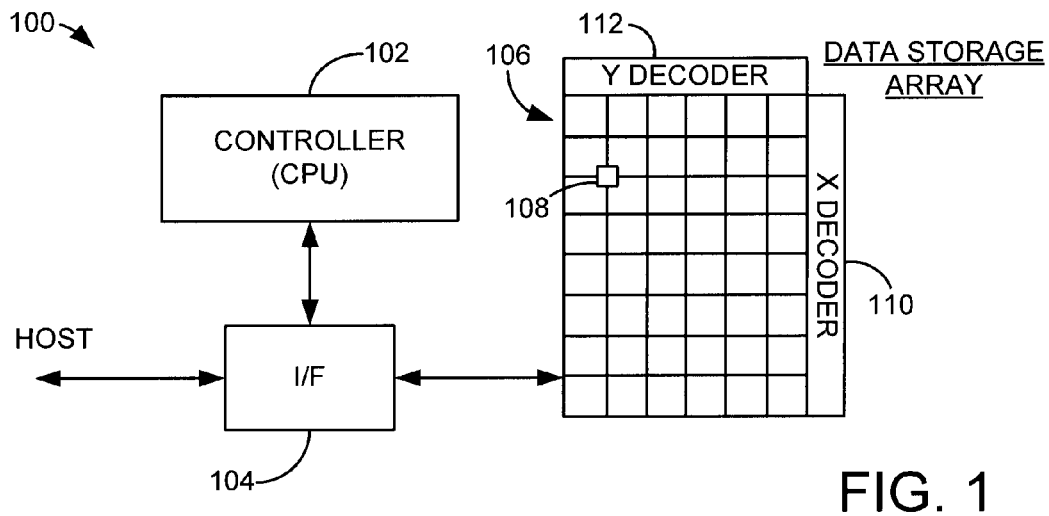
FIG. 1 is a generalized functional representation of an exemplary data storage device constructed and operated in accordance with various embodiments of the present invention.

As illustrated in the drawings, FIG. 1 provides a functional block representation of a data storage device 100 such as a solid state memory device utilizing individually addressable bits. Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of rows and columns of memory cells 108, although it will be appreciated that any number of rows and columns can be utilized as desired. In various embodiments, communications between the controller 102 and the memory space 106 are coordinated via the I/F 104 and conducted by the x decoder 110 and y decoder 112.

Figure 2:
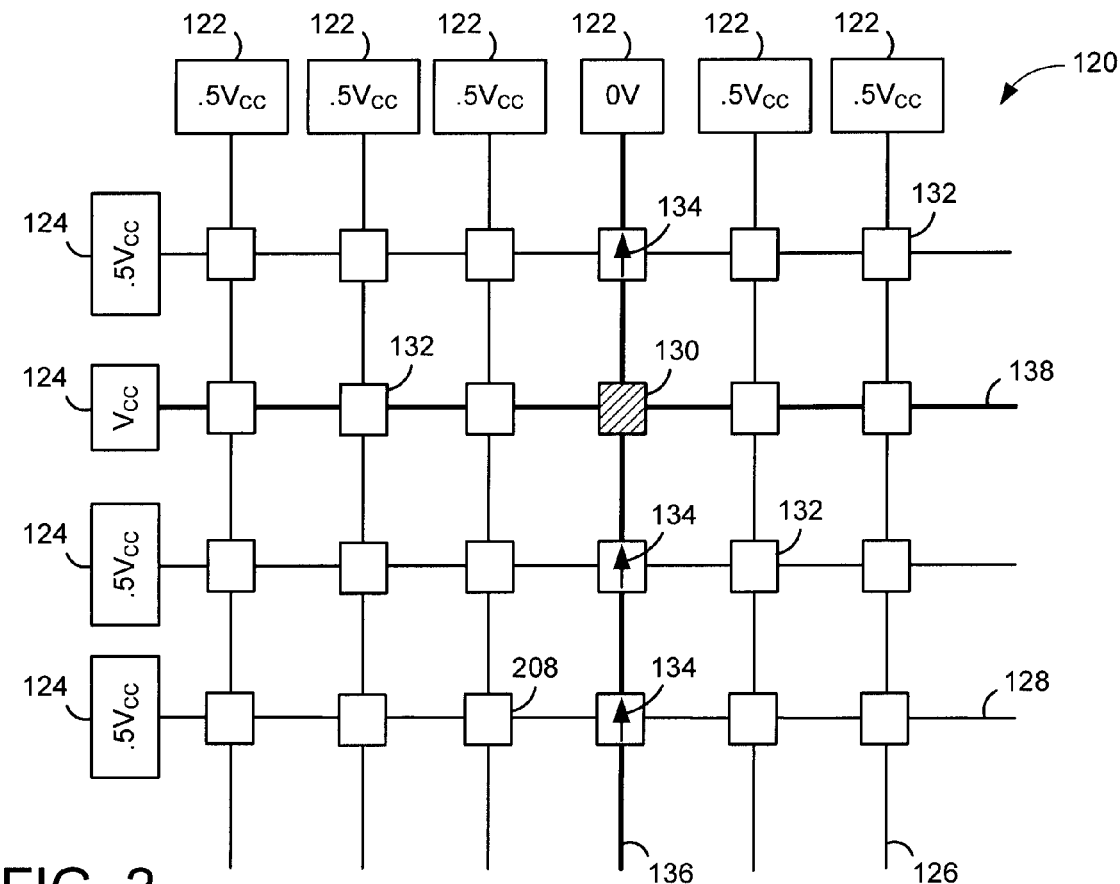
FIG. 2 shows circuitry used to read data from and write data to a memory array of the device of FIG. 1.

FIG. 2 displays a cross-point array of memory cells 120 capable of providing access to one or more memory cells. The cross-point array 120 can be constructed with a bit line driver 122 and a word line driver 124 corresponding to each bit line 126 and word line 128, respectively. In an exemplary operation, access to a predetermined memory cell 130 is provided by configuring the bit and word line drivers 122 and 124 to different voltages to allow current to pass from one line driver through the memory cell 130 to the other line driver. Meanwhile, the remaining unselected memory cells 132 can be precharged with a predetermined voltage, such as 0.5 Vcc, to avoid producing noise in the non-selected bit lines 126 and word lines 128.

However, operation of the cross-point array of memory cells 120 can produce unwanted current during data access operations. For example, unwanted current 134 can be produced along a selected bit line 136 and word line 138 due to the potential difference between the precharged unselected memory cells 132 and the voltage created by the word line driver 124. As such, the higher number of memory cells connected to the selected bit line 136 can result in an increased probability of error when accessing the predetermined memory cell 130.

Figure 3:
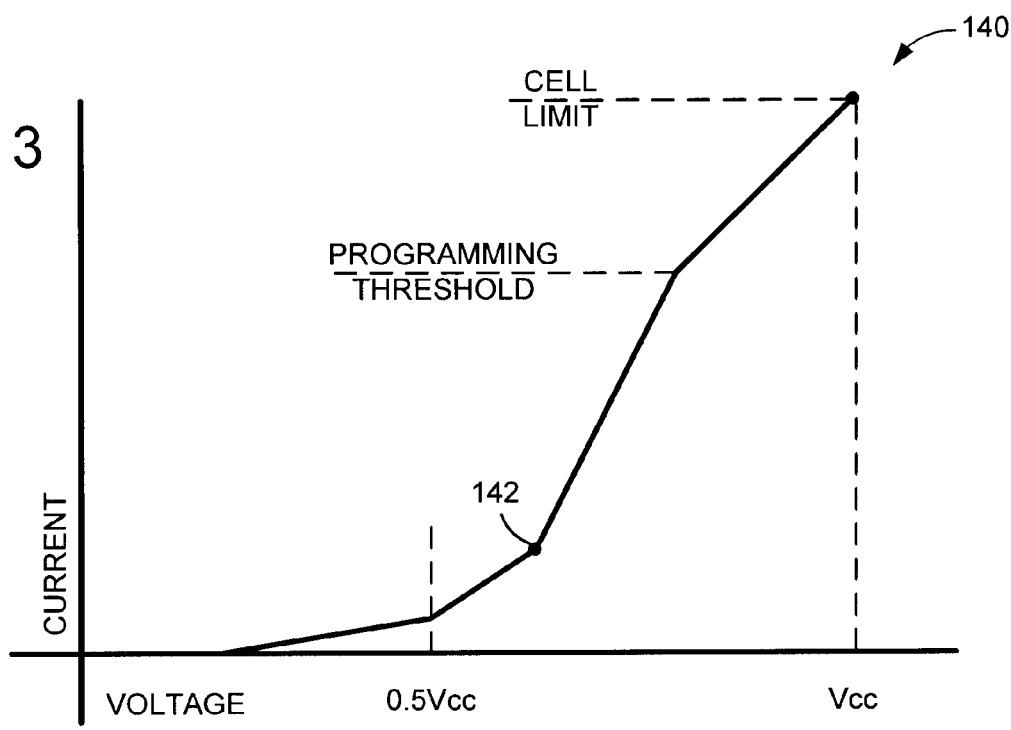
FIG. 3 graphs exemplary characteristics of a switching device operated in the cross-point array of memory cells of FIG. 2.

Exemplary characteristics 140 of the unwanted current shown in FIG. 2 are graphically illustrated in FIG. 3. As displayed, presence of unwanted current at point 142 creates noise that increases difficulty in providing data access. In some embodiments, the unwanted current 142 can reach such a magnitude to cause inadvertent programming and permanent damage to one or more memory cells. Hence, unwanted current 142 presents serious challenges to reliably and efficiently accessing data in a cross-point array of memory cells.

In response, a selection device, such as a field effect transistor (FET) can be connected to each memory cell. Such construction can prevent any unwanted current from reaching the memory cell, but can increase the time and power required to provide data access. Moreover, the inclusion of additional control lines needed to selectively control the various FET, in combination with the bulky physical size of most FET, can dramatically affect the scalability of a memory array.

Figure 4:
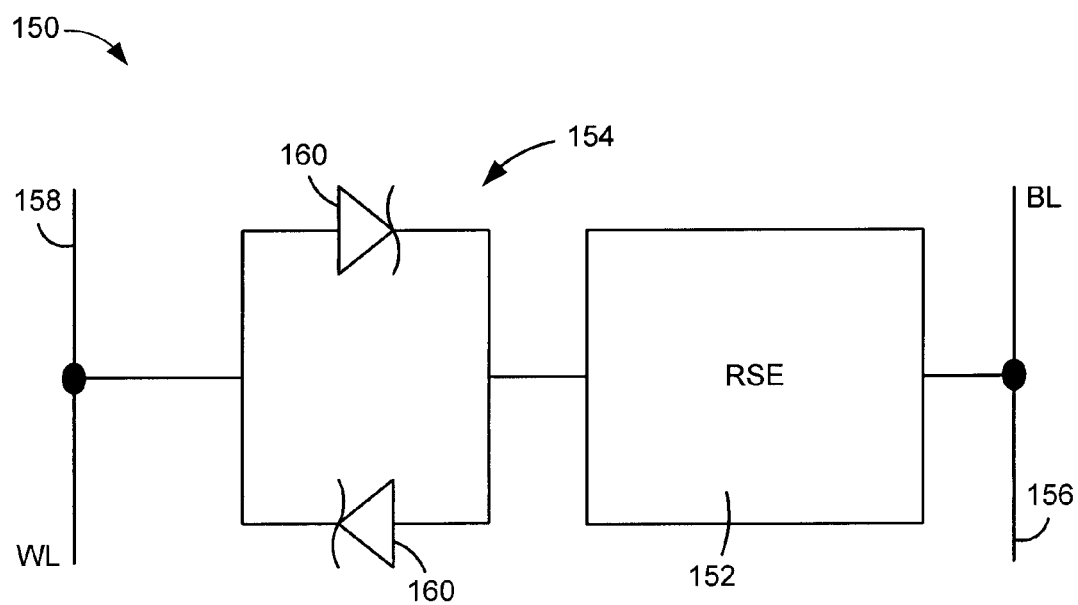
FIG. 4 shows an exemplary memory cell constructed and operated in accordance with various embodiments of the present invention.

As the practical scalability of data storage devices, such as solid state memories, becomes more important, the ability to reliably provide data access to selected bi-polar memory cells without added circuit complexity is at a premium. FIG. 4 displays an exemplary memory cell 150 to effectively control the presence of unwanted current while maintaining a scalable memory array. A resistive sense element (RSE) 152 is connected in series with an anti-parallel diode structure 154 and disposed between a bit line 156 and a word line 158.

The anti-parallel diode structure 154 can be constructed with a pair of diodes 160 connected in parallel but facing opposing directions to allow bi-polar current to pass through the RSE 152 while preventing current below a predetermined threshold from passing through the cell 150. In some embodiments, the diodes can be different types of diodes such as, but not limited to, Schottky, Zener, and Avalanche Zener diodes that have advantageous power and switching capabilities. However, the physical space required to construct a memory cell with multiple diodes connected in parallel can often make such a configuration impractical.

Figure 5:
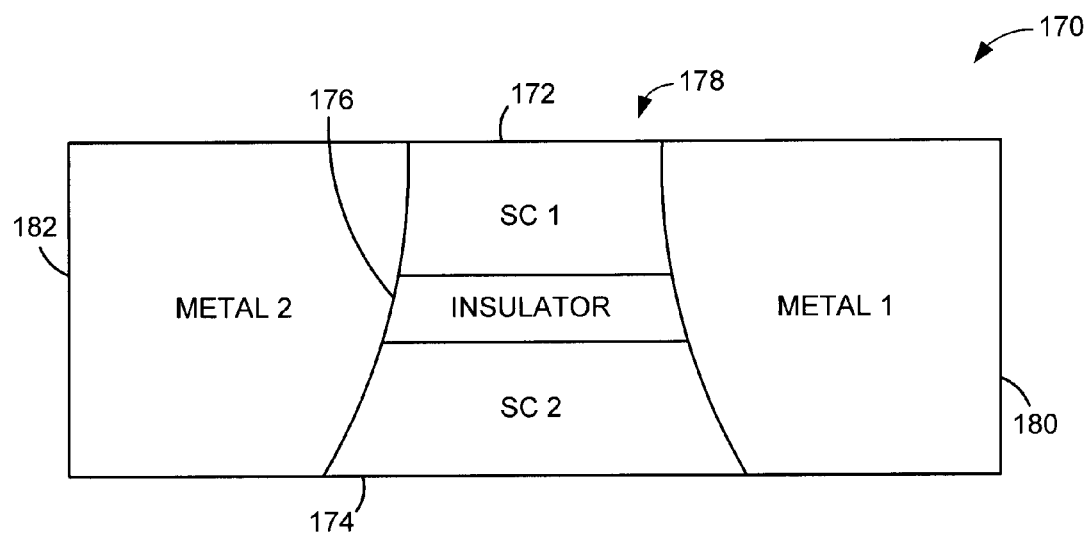
FIG. 5 illustrates an exemplary perspective view of the anti-parallel diode structure of the memory cell of FIG. 4.

In view of that, a single scalable anti-parallel diode structure that exhibits bi-polar current transfer and prevents current below a threshold from passing through the cell 150 can be implemented in existing cross-point arrays, such as array 120 of FIG. 2, to effectively eliminate data access errors associated with unwanted current. Such a scalable anti-parallel diode structure 170 is shown in FIG. 5 in accordance with various embodiments of the present invention. As illustrated, a first semiconductor layer (SC1) 172 and a second semiconductor layer (SC2) 174 are contactingly adjacent a first insulator layer 176 and form a semiconductor region 178. The semiconductor region 178 is bound on opposing sides by a first metal material 180 and a second metal material 182, respectively, that contactingly engage the first and second semiconductor layers 172 and 174 as well as the first insulator layer 176.

It should be noted that the configuration of the anti-parallel diode structure 170 and the orientation of the various constituents are merely exemplary and are in no way limiting. As such, the shape and design of the semiconductor region 178 can be modified, as desired. For example, the sidewalls can be asymmetrical while the first semiconductor layer 172 has a greater volume than the second semiconductor layer 174. Likewise, the metal materials 180 and 182 can be composed of either pure or alloy metals or composites and are not required to be similar shapes.

Figure 6:
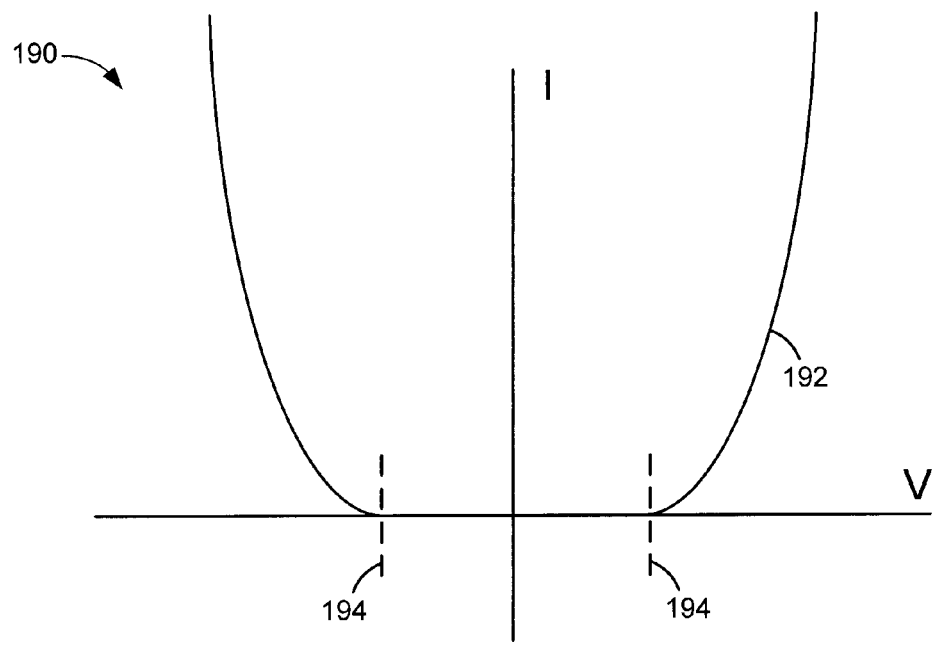
FIG. 6 graphs an exemplary operation of the anti-parallel diode structure of FIG. 5.

FIG. 6 graphs an exemplary operational characteristic 190 of the anti-parallel diode structure of FIG. 5. The power behavior 192 of the anti-parallel diode structure is plotted against current and voltage scales. In order to facilitate bipolar current, the anti-parallel diode structure exhibits symmetric characteristics for both positive and negative polarity currents. Such behavior supports that current below a predetermined threshold 194 will be rejected from passing through the structure while current above the predetermined threshold 194 will be allowed to flow through the structure.

That is, while unwanted voltage may be produced and present in various bit and word lines in the cross-point array, the anti-parallel diode structure can provide bi-polar data access to RSE while not allowing current below the predetermined threshold to flow. Thus, the negative affect of any unwanted current is effectively eliminated while maintaining bi-polar data access to the RSE. It should be noted that the term "bi-polar" means the bi-directional programming of RSE in which a first resistive state is written with a current from a first direction and a second resistive state is set with a current from an opposing second direction. Furthermore, a bi-polar current can be used herein to denote the symmetric but opposite power characteristics of the anti-parallel diode structure, shown in FIG. 6.

Figure 7A:
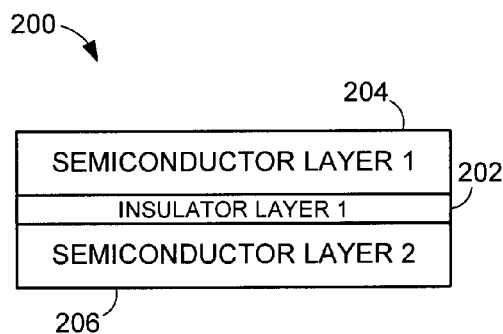
FIGS. 7A-7G generally illustrate an exemplary anti-parallel diode structure constructed in accordance with various embodiments of the present invention.

In FIGS. 7A-7G, an exemplary fabrication of an anti-parallel diode structure 200 is generally displayed. Initially, a first insulator layer (IL1) 202 is positioned between and contactingly adjacent to a first and second semiconductor layer (SL1) 204 and (SL2) 206, as shown in FIG. 7A. While not limiting, some embodiments of the present invention have the first semiconductor layer 204 doped as a p-type semiconductor while the second semiconductor layer is doped as an n-type semiconductor. Further, the deposition of the various layers are not limiting and can be facilitated with a variety of techniques, such as, but not limited to, atomic layer deposition, chemical vapor deposition, and physical vapor deposition.

Figure 7B:
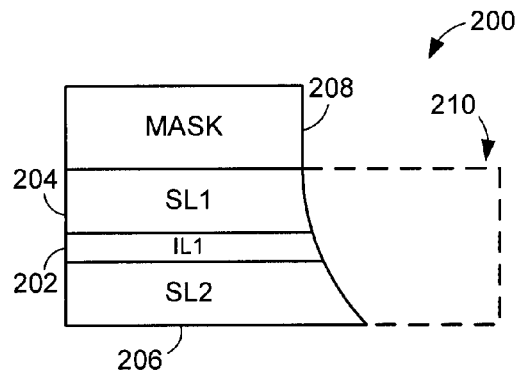
Figure 7C:
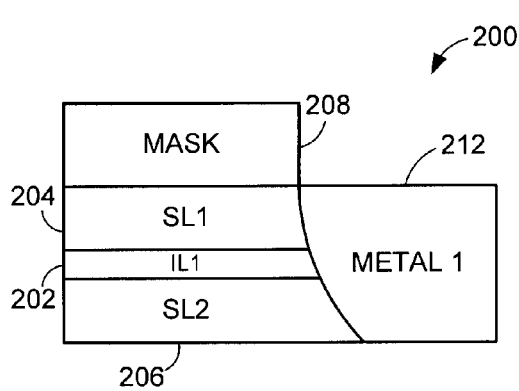

Turning to FIG. 7B, a mask 208 is deposited adjacent the first semiconductor layer 204 and the unmasked portion 210 of the semiconductor layers and insulator layer are subsequently etched. It can be appreciated that the shape of the sidewall separating the masked and unmasked portion is not limited to the configuration shown in FIG. 7B. That is, various sidewall shapes can be facilitated by varying etching time and intensity. The previously unmasked portion 210 is then replaced through the deposition of a first metal material 212, as displayed in FIG. 7C, that contactingly engages the first and second semiconductor layers 204 and 206 as well as the first insulator layer 202

Figure 7D:
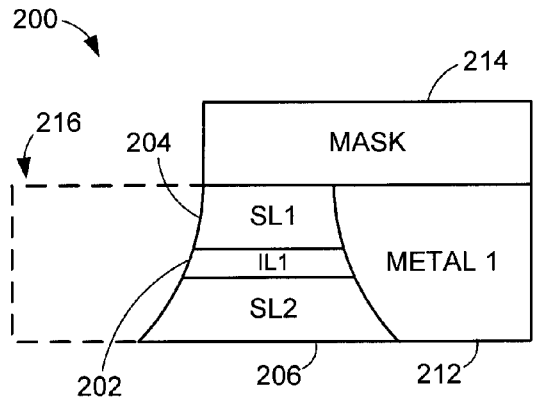
Figure 7E:
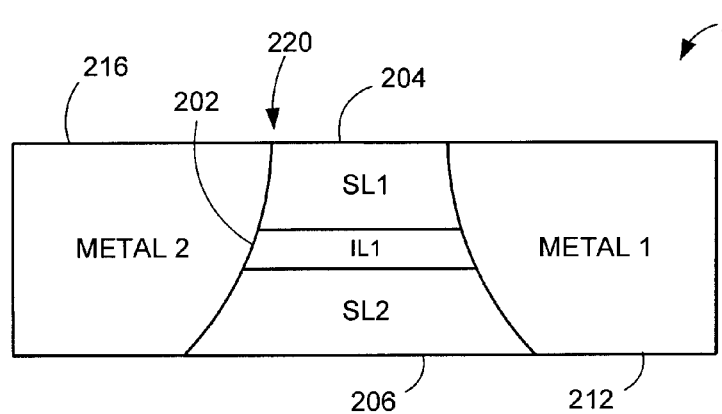

In FIG. 7D, another mask 214 is applied adjacent the semiconductor layers while the unmasked portion 216 of the layers are etched. A functioning anti-parallel diode structure 200 is present when a second metal material 218 is deposited in contacting engagement with the semiconductor layers 204 and 206 and the first insulator layer 202. While the metal materials 212 and 218 are shown on opposing sides of the semiconductor region 220 comprised of the semiconductor and insulator layers 202, 204, and 206, such configuration is not required or limited.

Figure 7F:
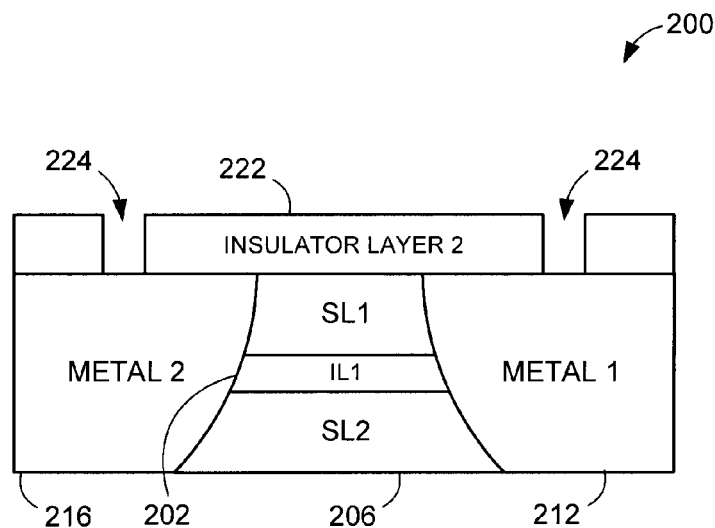

Further, a second insulator layer 222 can be added to cover one side of the first and second metal materials 212 and 216 as well as the first semiconductor layer 204, as displayed in FIG. 7F. It is anticipated that the second insulator layer can be deposited on any side of the anti-parallel diode structure 200 with a variety of deposition techniques. Operational access to the different metal materials 212 and 216 can be provided by creating access regions 224. It can be appreciated that various methods can be used to create the access regions 224 such as, but not limited to, mask and etch, mechanical drilling, and UV laser etching.

Figure 7G:
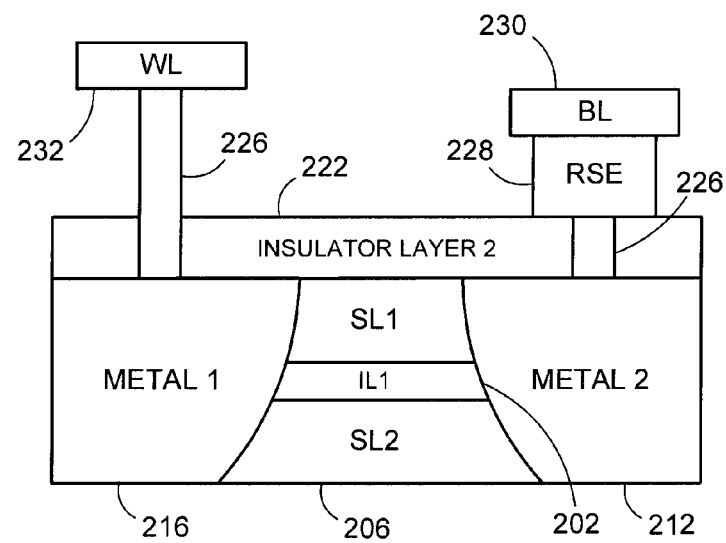

Subsequently, the access regions 224 can be filled with conductive vias 226, as shown in FIG. 7G. The conductive vias 226 can allow electrical connection between the first metal material 212 and an RSE 228 that is coupled to a bit line 230. Similarly, the second metal material 216 can be electrically connected to a word line 232 by a conductive via 226. It should be noted that the construction of the anti-parallel diode structure of FIG. 7G is merely exemplary and the various constituent components can be arranged, as desired. However, in some embodiments the conductive vias provide exclusive electrical access to each metal material 212 and 216, respectively.

Figure 8A:
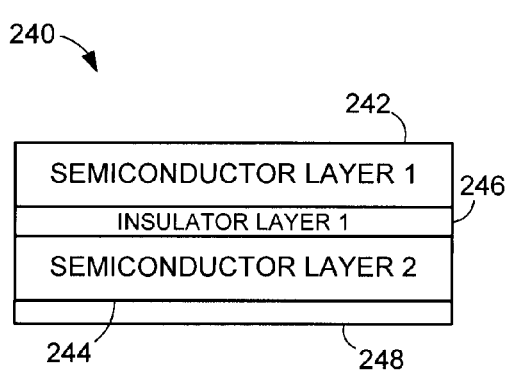
FIGS. 8A-8F provide another exemplary anti-parallel diode structure constructed in accordance with various embodiments of the present invention.
Figure 8B:
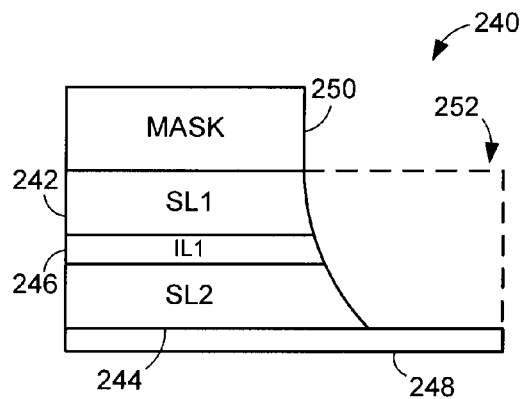

FIGS. 8A-8F generally illustrate an exemplary fabrication of another anti-parallel diode structure 240 in accordance with various embodiments of the present invention. FIG. 8A displays first and second semiconductor layers 242 and 244 deposited contactingly adjacent to opposing sides of a first insulator layer 246. In some embodiments, the various semiconductor and insulator layers are deposited on a rigid substrate 248. A portion of the substrate 248 is subsequently uncovered with the deposition of a mask 250 over a predetermined region of the semiconductor and insulator layers and the etching of the unmasked section 252 of the layers, as shown in FIG. 8B.

Figure 8C:
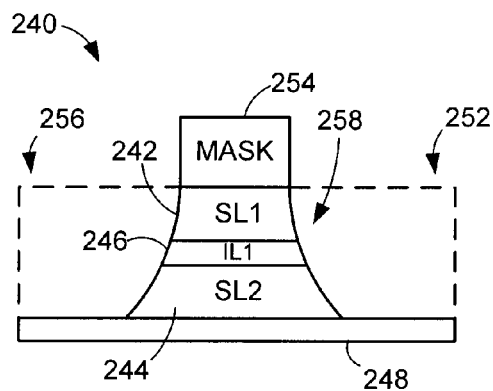
Figure 8D:
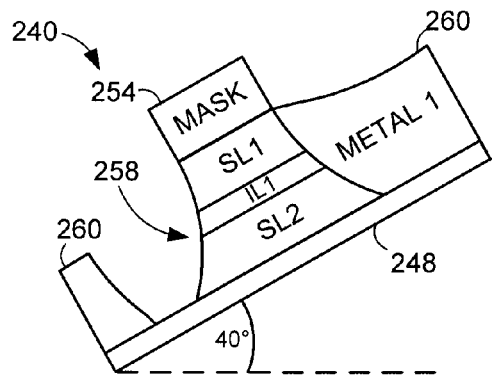

FIG. 8C displays that a second portion of the substrate 248 is uncovered with the deposition of a second mask 254 and the etching of the unmasked section 256 that results in the completed formation of the semiconductor region 258 that consists of both semiconductor layers 242 and 244 as well as the first insulator layer 246. A first metal material 260 is deposited while the substrate 248 is tilted to a first predetermined angle in relation to the horizontal. For example, the substrate 248 can be tilted at a 40 degree angle, as shown in FIG. 8D, while the first metal material 260 is deposited and settles to contactingly engage a first side of the semiconductor region 258 as well as occupying a portion of the substrate 248 proximal to the second side of the semiconductor region 258.

Figure 8E:
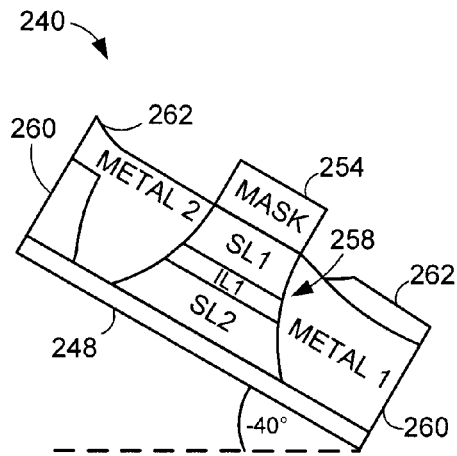
Figure 8F:
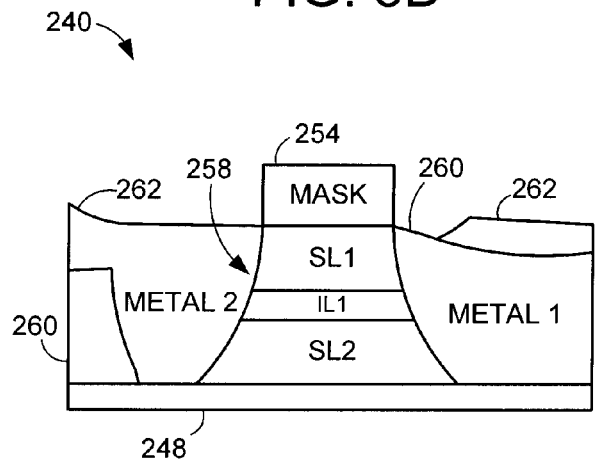

As displayed in FIG. 8E the substrate 248 can be tilted to a second predetermined angle in relation to the horizontal while a second metal material 262 is deposited to contactingly engage the second side of the semiconductor region 258 and the previously deposited first metal material 260. In various embodiments, the second predetermined angle is the same magnitude as the first predetermined angle but a negative value. That is, the second predetermined angle can be a negative angle such as the −40 degree angle displayed in FIG. 8E. FIG. 8F illustrates the anti-parallel diode structure 240 that has a non-uniform cross-section which consists of dissimilar metals.

It should be noted that the various masks used in the fabrication of the anti-parallel diode structure 240 can be removed with various techniques including, but not limited to, polishing. Also, the deposition methods used to construct the various constituent components of the anti-parallel diode structure 240 are not limited and can comprise a variety of different deposition methods, as needed or desired.

Figure 9:
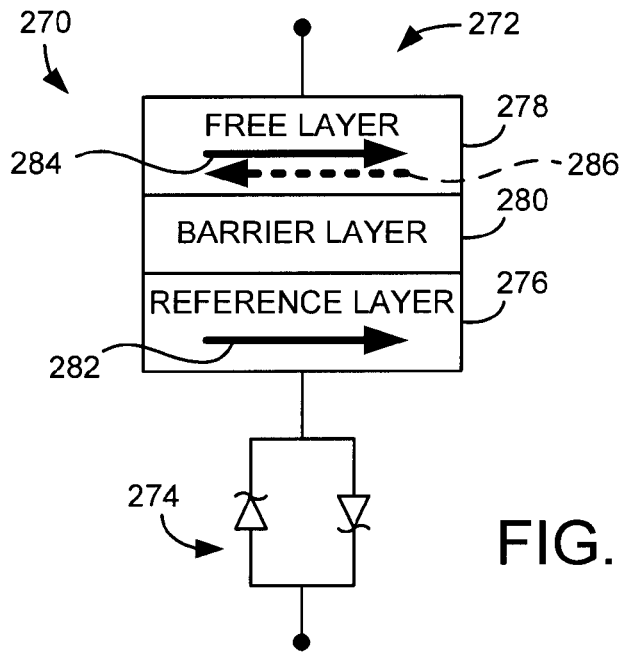
FIG. 9 shows an exemplary resistive sense element capable of being used in the exemplary memory cell of FIG. 2.

FIG. 9 generally illustrates an exemplary construction of a bidirectional memory cell 270. The memory cell 270 includes a resistive sense element (RSE) 272 coupled to an anti-parallel diode structure 274. The cell 270 has a spin-torque transfer random access memory (STRAM) configuration so that the RSE 272 is characterized as a magnetic tunneling junction (MTJ), although other cell configurations can be used.

The RSE 272 includes a fixed reference layer 276 and a programmable free layer 278 (recording layer) separated by an intervening tunneling (barrier) layer 280. The reference layer 276 has a fixed magnetic orientation in a selected direction, as indicated by arrow 282. This fixed magnetic orientation can be established in a number of ways, such as via pinning to a separate magnet (not shown).

The free layer 278 has a selectively programmable magnetic orientation that can be parallel (solid arrow 284) or anti-parallel (dotted arrow 286) with the selected direction of the reference layer 276. However, the magnetizations of the memory cell 270 is not limited or required as other respective magnetization orientations can be used, as desired.

A low resistance state for the RSE 272 is achieved when the magnetization of the free layer 278 is oriented to be substantially in the same direction (parallel) as the magnetization of the reference layer 276. To orient the RSE 272 in the parallel low resistance state, a write current passes through the RSE 272 so that the magnetization direction of the reference layer 276 sets the magnetic orientation of the free layer 278. Since electrons flow in the direction opposite to the direction of current, the write current direction passes from the free layer 278 to the reference layer 276, and the electrons travel from the reference layer 276 to the free layer 278.

A high resistance state for the RSE 272 is established in the anti-parallel orientation in which the magnetization direction of the free layer 278 is substantially opposite that of the reference layer 276. To orient the RSE 272 in the anti-parallel resistance state, a write current passes through the RSE 272 from the reference layer 276 to the free layer 278 so that spin-polarized electrons flow into the free layer 278 in the opposite direction.

In some embodiments, a low resistance, parallel state is used to represent a logical 0, and the high resistance, anti-parallel state is used to represent a logical 1. Additional programmed states can be used when the RSE is configured to store multiple bits. For example, programmed resistances $R1<R2<R3<R4$ can be used to respectively store multi-bit values "00," "01," "10" and "11."

Figure 10A:
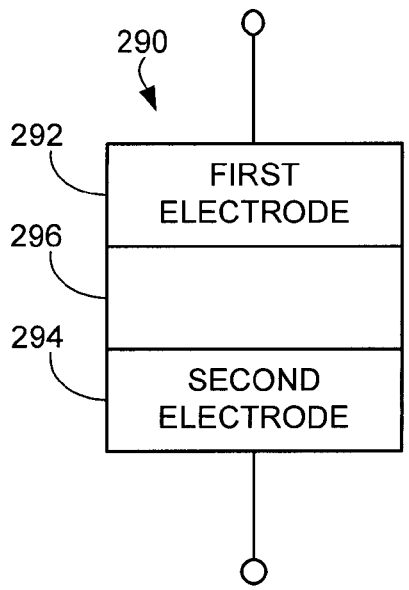
FIGS. 10A-10B display an exemplary resistive sense element capable of being used in the exemplary memory cell of FIG. 2.
Figure 10B:
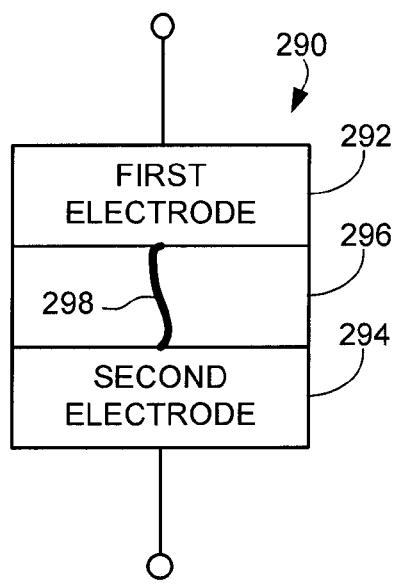

FIGS. 10A-10B show an exemplary RSE construction 290 characterized as resistive random access memory (RRAM). Opposing metal or metal alloy electrode layers 292, 294 are separated by an intervening oxide layer 296. A first, higher resistance programmed state is denoted by FIG. 1 OA, and a second, lower resistance programmed state is denoted by FIG. 10B.

In FIG. 10A, the relatively higher resistance state is established by the nominal electrical resistance of the oxide layer 296. Application of a suitable write voltage potential and/or write current in a selected direction across the RSE 290 will induce metal migration from the electrode layer 292, forming one or more electrically conductive metallization filaments 298 through the oxide layer as shown in FIG. 10B. Such filaments generally operate to lower the characteristic resistance of the cell. To return the programmed state of the RSE 290 to the high resistance state of FIG. 10A, an appropriate write voltage potential and/or current is applied through the RSE 290 in the opposite direction.

Figure 11A:
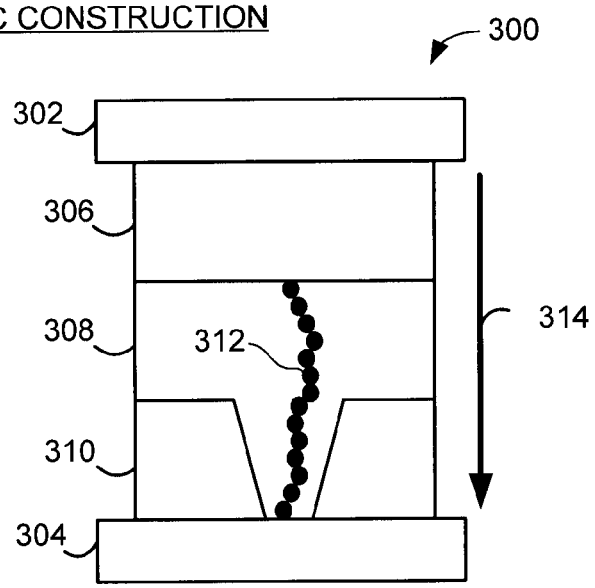
FIGS. 11A-11B illustrate an exemplary resistive sense element capable of being used in the exemplary memory cell of FIG. 2.
Figure 11B:
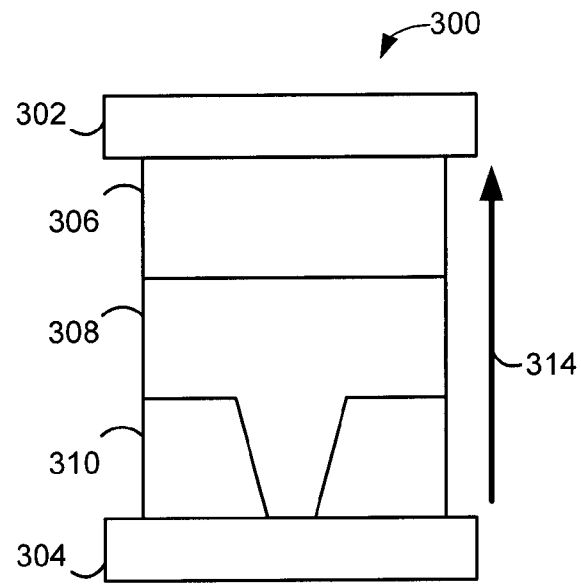

FIGS. 11A-11B illustrate an exemplary programmable metallization cell (PMC) element 300 suitable for use as a bidirectional or bipolar resistive sense element. The PMC element 300 includes top and bottom electrodes 302, 304, a metal layer 306, an electrolyte layer 308 and a dielectric layer 310. Control circuitry (not shown) can be used to adjust the relative voltage potential between the first and second electrodes 302, 304, resulting in passage of a write current 312 through the PMC element 300 to form a filament 314.

The filament 314 establishes an electrically conductive path between the metal layer 306 and the bottom electrode 304 by the migration of ions from the metal layer 306 and electrons from the bottom electrode 304. The dielectric layer 310 focuses a small area of electron migration from the bottom electrode 304 in order to control the position of the resulting filament 314. The filament reduces the effective resistance of the PMC element 300 to a relatively low resistance, which can be assigned a selected logical value such as logical 1.

Subsequent application of a write current 316 in a second direction through the PMC element causes migration of the ions and electrons back to the respective electrodes 302, 304, as shown in FIG. 11B. This resets the PMC element 300 to its initial high electrical resistance, which can be assigned a different logical value such as logical 0. PMC elements with a construction similar to that shown at 300 can alternatively be programmed using unipolar programming currents of different magnitudes and/or pulse widths.

Figure 12:
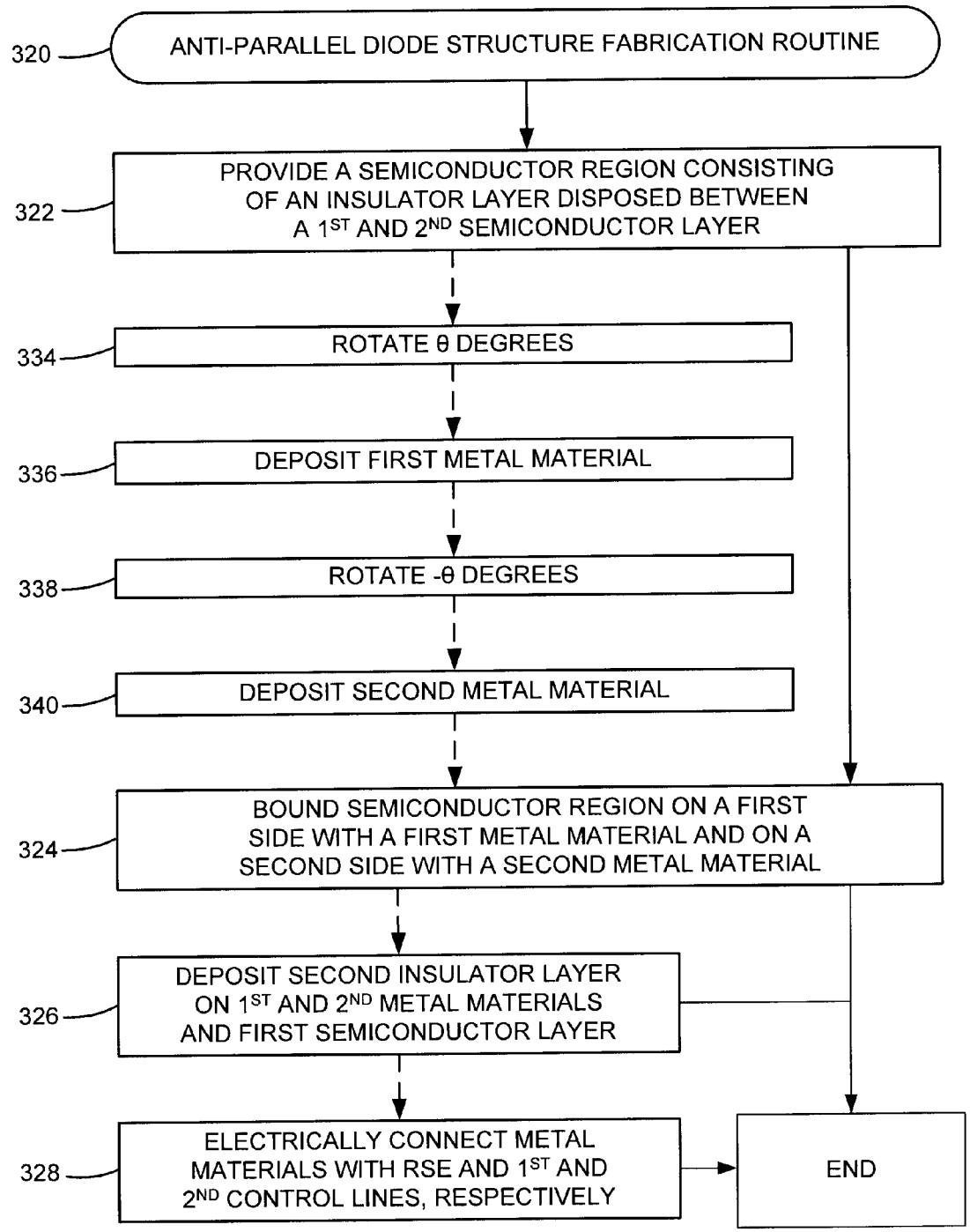
FIG. 12 displays a flowchart of an anti-parallel diode structure fabrication routine performed in accordance with various embodiments of the present invention.

FIG. 12 provides a flowchart of an anti-parallel diode structure fabrication routine 320 performed in accordance with various embodiments of the present invention. Initially in step 322, a semiconductor region is provided that consists of an insulator layer disposed between a first and second semiconductor layer. The semiconductor region is then bound, in step 324, on a first side by a first metal material and on a second side by a second metal material. The resultant anti-parallel diode structure prevents current below a predetermined value from passing through the semiconductor region and allows current above the predetermined value to pass through the semiconductor region.

Optionally, step 324 can be completed with steps 334, 336, 338, and 340 further described in FIGS. 8A-8F. In step 334, the structure is rotated θ degrees and then, in step 336, the first metal material is deposited on the structure. The structure is then rotated −θ degrees from the original position in step 338 and the second metal material is deposited in step 340.

Subsequently in optional step 326, a second insulator layer is deposited in contacting engagement with the first semiconductor layer, first metal material, and second metal material while providing access regions to both first and second metal materials, respectively. Further in optional step 328, the first metal material is electrically connected to an RSE and a first control line while the second metal material is electrically connected to a second control line with conductive vias that occupy each access region in the second insulator layer.

It should be noted that the steps of the anti-parallel diode structure fabrication routine 320 are not limited. That is, the various steps can be omitted, moved, or modified without deterring from the spirit of the present invention.

As can be appreciated by one skilled in the art, the various embodiments illustrated herein provide advantageous data access to particular memory cells in a cross-point array. The effective isolation of unwanted current away from resistive sense elements allows for reliable data access operations and scaleable memory arrays. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A semiconductor stack, comprising:
    a multi-layer semiconductor region comprising a plurality of semiconductor layers;
    a first metal material disposed adjacent a first side surface of the multi-layer semiconductor region in contacting engagement with each of said plurality of semiconductor layers;
    a second metal material disposed adjacent a second side surface of the multi-layer semiconductor region in contacting engagement with each of said plurality of semiconductor layers, wherein the first and second metal materials are dissimilar metals, and the first and second side surfaces are different sides;
    a programmable resistive sense element (RSE) coupled to the first metal material;
    a first conductive control line coupled to the RSE opposite the first metal material; and
    a second conductive control line coupled to the second metal material.

2. The semiconductor stack of claim 1, in which the plurality of semiconductor layers comprises a first semiconductor layer of n doped material and a second semiconductor layer of p doped material.

3. The semiconductor stack of claim 2, in which the plurality of semiconductor layers further comprises an intervening insulative layer disposed between the first and second semiconductor layers.

4. The semiconductor stack of claim 1, in which the multi-layer semiconductor region, the first metal material and the second metal material are respectively supported on a common rigid substrate.

5. The semiconductor stack of claim 1, further comprising an insulative layer which extends adjacent to and contactingly engages each of the first metal material, a top surface of the multi-layer semiconductor region, and the second metal material.

6. The semiconductor stack of claim 1, further comprising a first conductive support structure which extends from the first metal material to contactingly engage the RSE, and a second conductive support structure which extends from the second metal material to contactingly engage the second control line.

7. The semiconductor stack of claim 1, in which the semiconductor stack forms a selected memory cell in a cross-point memory array comprising a plurality of additional memory cells nominally identical to the selected memory cell, in which the first control line extends across said array in a first direction, and the second control line extends across said array in a second direction orthogonal to the first direction.

8. The semiconductor stack of claim 1, in which the RSE is characterized as a magnetic tunneling junction (MTJ) comprising a reference layer having a fixed magnetic orientation, a programmable free layer having a variable magnetic orientation, and a tunnel barrier layer between the reference and free layers.

9. The semiconductor stack of claim 1, in which the first and second metal materials are selected such that bi-directional currents flow through the stack between the first and second control lines responsive to a voltage magnitude differential between said control lines exceeding a selected threshold, and nominally zero current flows through the stack between the first and second control lines responsive to a voltage magnitude differential between said control lines being below the selected threshold.

10. A data storage device comprising a cross-point memory array of memory cells arranged into rows and columns and decoder circuitry adapted to access said memory cells via control lines extending across said array, each memory cell in the array comprising a multi-layer semiconductor region comprising a plurality of semiconductor layers, a first metal material disposed adjacent a first side surface of the multi-layer semiconductor region in contacting engagement with each of said plurality of semiconductor layers, a second metal material disposed adjacent a second side surface of the multi-layer semiconductor region in contacting engagement with each of said plurality of semiconductor layers, wherein the first and second metal materials are dissimilar metals, and the first and second side surfaces are different sides, and a programmable resistive sense element (RSE) coupled to the first metal material.

11. The data storage device of claim 10, further comprising a controller adapted to direct data transfer operations between the memory array and a host device.

12. The data storage device of claim 10, in which the control lines comprise bit lines which extend in a first direction across the array and word lines which extend in a different, second direction across the array, wherein each of the memory cells is coupled to a respective selected bit line and to a respective selected word line.

13. The data storage device of claim 12, in which the first and second metal materials of each of the memory cells are selected such that bi-directional currents flow through the associated memory cell between the respective selected bit and word lines responsive to a voltage magnitude differential between said lines exceeding a selected threshold, and nominally zero current flows through the associated memory cell between said lines responsive to a voltage magnitude differential between said lines being below the selected threshold.

14. The data storage device of claim 10, in which the RSE in each of the memory cells is characterized as a magnetic tunneling junction (MTJ) comprising a reference layer having a fixed magnetic orientation, a programmable free layer having a variable magnetic orientation, and a tunnel barrier layer between the reference and free layers.

15. A method of forming a non-volatile memory cell, comprising:
    forming a first semiconductor layer of a first doping type on a base substrate, an insulative layer on the first semiconductor layer, and a second semiconductor layer of a different second doping type on the insulative layer to provide a multi-layer semiconductor region;
    depositing a first metal material adjacent a first side surface of the multi-layer semiconductor region so as to be coupled to each of the first and second semiconductor layers and the insulative layer;
    subsequently depositing a second metal material adjacent a second side surface of the multi-layer semiconductor region so as to be coupled to each of the first and second semiconductor layers and the insulative layer, wherein the first and second metal materials are dissimilar metals; and
    coupling a programmable resistive sense element (RSE) to the the first metal material.

16. The method of claim 15, further comprising forming a second sulative layer that extends across respective top surfaces of the first and second metal materials and the second semiconductor layer, and a conductive support structure that extends through the second insulative layer to contactingly engage the RSE.

17. The method of claim 15, further comprising forming a first control line that extends adjacent the memory cell in a first direction and a second control line that extends adjacent the memory cell in a different second direction, the first control line coupled to the RSE and the second control line coupled to the second metal material.

18. The method of claim 15, in which a selected one of the first or second doping types is characterized as n doping, and a remaining one of the first or second doping types is characterized as p doping.

19. The method of claim 15, in which the first and second metal materials are deposited on the base substrate and contactingly engage the respective first and second semiconductor layers and the intervening insulative layer.

20. The method of claim 15, in which the RSE is characterized as a magnetic tunneling junction (MTJ) comprising a reference layer having a fixed magnetic orientation, a programmable free layer having a variable magnetic orientation, and a tunnel barrier layer between the reference and free layers.

* * * * *